(12) United States Patent
Robin et al.

(10) Patent No.: US 10,937,827 B2
(45) Date of Patent: Mar. 2, 2021

(54) PSEUDO-SUBSTRATE FOR OPTOELECTRONIC DEVICE AND ITS MANUFACTURING METHOD

(71) Applicant: ALEDIA, Grenoble (FR)

(72) Inventors: Ivan-Christophe Robin, Grenoble (FR); Jérôme Napierala, Saint Egrève (FR)

(73) Assignee: ALEDIA, Grenoble (FR)

( * ) Notice: Subject to any disclaimer, the term of this patent is extended or adjusted under 35 U.S.C. 154(b) by 0 days.

(21) Appl. No.: 16/958,142

(22) PCT Filed: Nov. 21, 2018

(86) PCT No.: PCT/FR2018/052936
§ 371 (c)(1),
(2) Date: Jun. 25, 2020

(87) PCT Pub. No.: WO2019/129945
PCT Pub. Date: Jul. 4, 2019

(65) Prior Publication Data
US 2020/0357848 A1   Nov. 12, 2020

(30) Foreign Application Priority Data

Dec. 27, 2017 (FR) ...................................... 1763274

(51) Int. Cl.
*H01L 27/15* (2006.01)
*H01L 33/12* (2010.01)
(Continued)

(52) U.S. Cl.
CPC ........ *H01L 27/156* (2013.01); *H01L 33/0075* (2013.01); *H01L 33/12* (2013.01); *H01L 33/24* (2013.01); *H01L 33/32* (2013.01)

(58) Field of Classification Search
CPC combination set(s) only.
See application file for complete search history.

(56) References Cited

U.S. PATENT DOCUMENTS 10,424,692 B2   9/2019   Amstatt et al.
2007/0085093 A1*  4/2007   Ohmae ............... H01L 21/0262
                                                    257/89
(Continued)

FOREIGN PATENT DOCUMENTS

EP    2665100 A2    11/2013
WO   2016116703 A1   7/2016

OTHER PUBLICATIONS

English Translation International Search Report for Application No. PCT/FR2018/052936.
(Continued)

*Primary Examiner* — Mamadou L Diallo
(74) *Attorney, Agent, or Firm* — Cantor Colburn LLP

(57) ABSTRACT

A pseudosubstrate for an optoelectronic device suitable for the growth of light-emitting diodes including a substrate and a buffer structure formed on an upper face of the substrate. The buffer structure includes at least one first portion wherein one layer made of solid gallium nitride (GaN) delimits at least one free surface of a first type facing away from the upper face of the substrate, each free surface of the first type being suitable for the growth on same of at least one light-emitting diode mostly based on a III-V compound capable of emitting light at a first wavelength. The buffer structure including at least one second portion wherein a stack alternating layers of indium and gallium nitride (InGaN) and intermediate layers of GaN and in which the indium is present in a first weight ratio, delimits at least one free surface of a second type facing away from the upper face of the substrate, each free surface of the second type being suited to the growth on same of at least one light-emitting diode mostly based on a III-V compound capable of emitting light at a second wavelength different from the first wavelength. The second portion of the buffer structure is offset relative to the first portion of the buffer structure in a (Continued)

general plane (P) oriented parallel to the plane of the upper face of the substrate. Also described is an optoelectronic device and a manufacturing method.

20 Claims, 4 Drawing Sheets

(51) Int. Cl.
*H01L 33/00* (2010.01)
*H01L 33/32* (2010.01)
*H01L 33/24* (2010.01)

(56) References Cited

U.S. PATENT DOCUMENTS

| | | | |
|---|---|---|---|
| 2017/0092485 A1* | 3/2017 | Brueck | H01L 21/0251 |
| 2018/0114878 A1* | 4/2018 | Danesh | H01L 33/62 |
| 2019/0109262 A1* | 4/2019 | Danesh | H01L 33/0095 |
| 2019/0189835 A1* | 6/2019 | Dussaigne | H01L 33/32 |

OTHER PUBLICATIONS

International Search Report for Application No. PCT/FR2018/052936.
Written Opinion for Application No. PCT/FR2018/052936.
English Translation IWritten Opinion for Application No. PCT/FR2018/052936.

* cited by examiner

US 10,937,827 B2

PSEUDO-SUBSTRATE FOR OPTOELECTRONIC DEVICE AND ITS MANUFACTURING METHOD

CROSS REFERENCE TO RELATED APPLICATIONS

This application is a National Stage of PCT Application No. PCT/FR2018/052936 filed on Nov. 21, 2018, which claims priority to French Patent Application No. 17/63274 filed on Dec. 27, 2017, the contents each of which are incorporated herein by reference thereto.

TECHNICAL FIELD

The present invention concerns a pseudo-substrate for an optoelectronic device, suitable for the growth of light-emitting diodes on the pseudo-substrate, the pseudo-substrate comprising a substrate and a buffer structure formed on an upper face of the substrate.

The invention also concerns a method for manufacturing such a pseudo-substrate, an optoelectronic device as such and a method for obtaining such an optoelectronic device.

The invention applies in particular in display screens or image projection systems.

BACKGROUND

The term <<optoelectronic device>> means a device suitable for converting an electrical signal into electromagnetic radiation, and in particular a device dedicated to the emission of electromagnetic radiation, in particular light.

To this end, an optoelectronic device conventionally comprises light-emitting diodes, also known by the acronym LED for <<light-emitting diode>>.

It is known that each light-emitting diode comprises an active material exploiting quantum wells, a semiconductor portion doped according to a first type of doping to act as doped junction P and a semiconductor portion doped according to a second type of doping to act as doped junction N.

Each light-emitting diode can be formed on the basis of three-dimensional semiconductor elements, themselves at least partially obtained by epitaxial growth. Light-emitting diodes are typically formed from a semiconductor material comprising elements from column III and column V of the periodic table, such as a III-V compound, in particular gallium nitride (GaN), indium gallium nitride (InGaN) or aluminum gallium nitride (AlGaN).

There are optoelectronic devices including a matrix of light-emitting diodes having a certain emission surface. Such optoelectronic devices can in particular be used in the constitution of display screens or image projection systems, where the matrix of light-emitting diodes in fact defines a matrix of light pixels where each pixel includes one or more light-emitting diodes.

One of the difficulties is to achieve that each pixel can emit lights of different colors, for example blue, green and red.

A first known solution provides for the matrix to be organized such that each pixel comprises at least one light-emitting diode capable of emitting blue light, at least one light-emitting diode capable of emitting green light and at least one light-emitting diode capable of emit red light. To achieve this, the light-emitting diodes which are capable of emitting light in a given color are manufactured on the same substrate, this being repeated separately for the three colors. Then each substrate is cut in order to delimit individual devices. Each pixel is then obtained by reconstruction in order to associate such individual devices so as to dispose the three colors.

This solution also known under the name of <<pick and place>> is not optimal because it generates numerous manipulations, high manufacturing time and costs, as well as a significant number of connections. Considering the continuous increasing miniaturization, this solution can sometimes even be unfortunately impossible to implement.

Moreover, the red color is generally obtained from InGaAlP, but this technique has disadvantages, such as having a significant variation of the wavelength as a function of temperature, the fact of varying efficiency depending on the size of the light-emitting diodes (the efficiency decreasing for micro diodes less than 30 microns) and the fact that the growth of this material is delicate.

A second solution consists in providing for the light-emitting diodes to be adapted to emit light in the blue colors. So that the light pixel can emit in the green colors and/or in the red colors, the latter can include photoluminescent pads acting as a color converter: each photoluminescent pad is designed so as to absorb at least one portion of the blue light emitted by the light-emitting diodes and to emit in response a green light or red light. These photoluminescent pads are usually formed of a suitable bonding matrix.

Nonetheless, this solution is not entirely satisfactory since the photoluminescent pads induce high light losses. Generally, the conversion rate of the pads is indeed comprised between 50% and 80%. In addition, it remains complex and fairly expensive to implement due to the operations dedicated to the manufacturing of photoluminescent pads.

BRIEF SUMMARY

The present invention aims to solve all or part of the drawbacks presented above.

In this context, an objective is therefore to provide a solution that meets at least one of the following objectives:
  proposing simple and economical manufacturing,
  having a high light output
  incorporating high amounts of In, in particular in a proportion greater than 20%, in quantum wells of InGaN without degrading the efficiency of the wells, in particular to avoid the use of InGaAlP.

This objective can be achieved by providing a pseudo-substrate for an optoelectronic device, the pseudo-substrate being adapted to the growth of light-emitting diodes on the pseudo-substrate, the pseudo-substrate comprising a substrate and a buffer structure formed on an upper face of the substrate, the buffer structure comprising:
  at least one first portion where a layer formed of bulk gallium nitride delimits at least one free surface of a first type turned on the side opposite to the upper face of the substrate, each free surface of the first type being adapted to growth thereon of at least one light-emitting diode mainly based on a III-V compound capable of emitting light at a first wavelength,
  and at least one second portion where a stack alternating layers of indium gallium nitride and intermediate layers of GaN and in which the indium is present in a first mass proportion, delimits at least one free surface of a second type turned on the side opposite to the upper face of the substrate, each free surface of the second type being adapted to the growth thereon of at least one light-emitting diode mainly based on a III-V compound capable of emitting light at a second wavelength different from the first wavelength, said at least one second portion of the buffer structure being offset with respect to said at least one first portion of the buffer structure in a general plane oriented parallel to the plane of the upper face of the substrate.

Such a pseudo-substrate makes it possible to respond to the problems presented above because it allows the growth, on the free surfaces of the different portions of the buffer structure, of light-emitting diodes capable of emitting light at different wavelengths: typically blue and red, blue and green, or all three. In other words, a single pseudo-substrate makes it possible to achieve the provision, after obtaining the optoelectronic device, of polychrome light pixels by simple growth of light-emitting diodes on the free surfaces of the different portions of the buffer structure. This technique allows overcoming the need to use the first solution described in connection with the state of the art or the need to have to use color converters.

Furthermore, all of the light-emitting diodes which are capable of emitting lights of different colors are however very advantageously obtained by identical growth process whatever the considered free surface of the buffer structure; the nature of the material of the buffer structure at each of the free surfaces of the first type and of the second type ensures an adaptation of the color of the light which is emitted by the light-emitting diodes formed on these free surfaces between a blue color, a green color and/or a red color.

Moreover, the provision of such a pseudo-substrate very advantageously allows incorporating high quantities of indium, in particular in a proportion greater than 20%, in quantum wells of InGaN without degrading the efficiency of the wells.

The pseudo-substrate can also meet the technical characteristics presented below, considered alone or in combination.

At the level of said at least one second portion of the buffer structure, the stack alternating layers of InGaN and intermediate layers of GaN is at least partially formed on the upper face of the substrate, and the pseudo-substrate comprising a nucleation layer formed on the upper face of the substrate, at the level of said at least one second portion of the buffer structure, the stack alternating layers of InGaN and intermediate layers of GaN is at least partially formed on the nucleation layer.

The stack alternating layers of InGaN and intermediate layers of GaN of said at least one second portion is in the form of at least one nano-element in the form of a wire or in the form of a pyramid.

The buffer structure comprises at least one third portion where a stack alternating layers of InGaN and intermediate layers of GaN and in which the indium is present in a second mass proportion strictly different from the first mass proportion, delimits at least one free surface of a third type turned on the side opposite to the upper face of the substrate, each free surface of the third type being adapted to the growth thereon of at least one light-emitting diode mainly based on a III-V compound capable of emitting light at a third wavelength different from the first wavelength and the second wavelength, and said at least one third portion of the buffer structure is offset with respect to said at least one first portion of the buffer structure and with respect to said at least one second portion of the buffer structure in the general plane oriented in parallel to the plane of the upper face of the substrate.

At the level of said at least one third portion of the buffer structure, the stack alternating layers of InGaN and intermediate layers of GaN is at least partially formed on the upper face of the substrate, and the pseudo-substrate comprising a nucleation layer formed on the upper face of the substrate, at said at least one third portion of the buffer structure, the stack alternating layers of InGaN and intermediate layers of GaN is at least partially formed on the nucleation layer.

The stack alternating layers of InGaN and intermediate layers of GaN of said at least one third portion is in the form of at least one nano-element in the form of a wire or in the form of a pyramid.

The first mass proportion of indium at the level of said at least one second portion is included in a range between 5 and 25%, preferably between 10 and 20%. The second mass proportion of indium at the level of said at least one third portion is included in a range between 5 and 25%, preferably between 10 and 20%.

The invention also concerns an optoelectronic device comprising such a pseudo-substrate and:
 at least one light-emitting diode mainly based on a III-V compound formed by growth on the free surface of the first type of said at least one first portion of the buffer structure of the pseudo-substrate and capable of emitting light at the first wavelength,
 at least one light-emitting diode mainly based on a III-V compound formed by growth on the free surface of the second type of said at least one second portion of the buffer structure of the pseudo-substrate and capable of emitting light at the second wavelength different from the first wavelength.

The optoelectronic device comprises at least one light-emitting diode mainly based on a III-V compound formed by growth on the free surface of the third type of said at least one third portion of the buffer structure of the pseudo-substrate and capable of emitting light at the third wavelength different from the first wavelength and the second wavelength.

The invention also concerns a method for manufacturing such a pseudo-substrate which comprises a first step of providing the substrate, a second step of forming the layer formed of bulk GaN on the upper face of the substrate, a third step of forming the stack alternating layers of InGaN and intermediate layers of GaN and in which the indium is present in the first mass proportion, on the layer resulting from the second step and/or on the upper face of the substrate.

The third step may comprise successive steps of depositing layers of InGaN and intermediate layers of GaN in openings delimited by a first mask covering the layer of bulk GaN resulting from the second step.

Alternatively, the third step may comprise a first set of successive steps of depositing layers of InGaN and intermediate layers of GaN over the entire surface of the layer resulting from the second step, then a first step of etching through a stack which results from said first set of successive deposition steps, said first etching step being carried out so as to make determined surfaces of the layer which results from the second step free, said made free surfaces corresponding to free surfaces of first type of said at least one first portion of the buffer structure.

The method can comprise a fourth step of forming the stack alternating layers of InGaN and intermediate layers of GaN and in which the indium is present in the second mass proportion, on the layer resulting from the second step and/or on the stack resulting from the third step.

According to a particular embodiment, the fourth step comprises successive steps of depositing layers of InGaN and intermediate layers of GaN in all or part of the openings surface of a second mask coveting at least the layer of bulk GaN which results from the second step.

The fourth step may comprise a second set of successive steps of depositing layers of InGaN and intermediate layers of GaN over the entire surface of the stack resulting from the first set of successive steps of depositing, then a second etching step through a stack which results from said second set of successive deposition steps, said second etching step being carried out so as to make determined surfaces of the stack which results from the first set of successive deposition steps free, said made free surfaces corresponding to free surfaces of the second type of said at least one second portion of the buffer structure.

BRIEF DESCRIPTION OF THE DRAWINGS

The invention will be better understood from the following description of particular embodiments of the invention provided as non-limiting examples and represented in the appended drawings, in which.

DETAILED DESCRIPTION

In the figures and in the following description, the same references represent the same or similar elements. In addition, the various elements are not represented to scale so as to favor the clarity of the figures.

Figure 1:
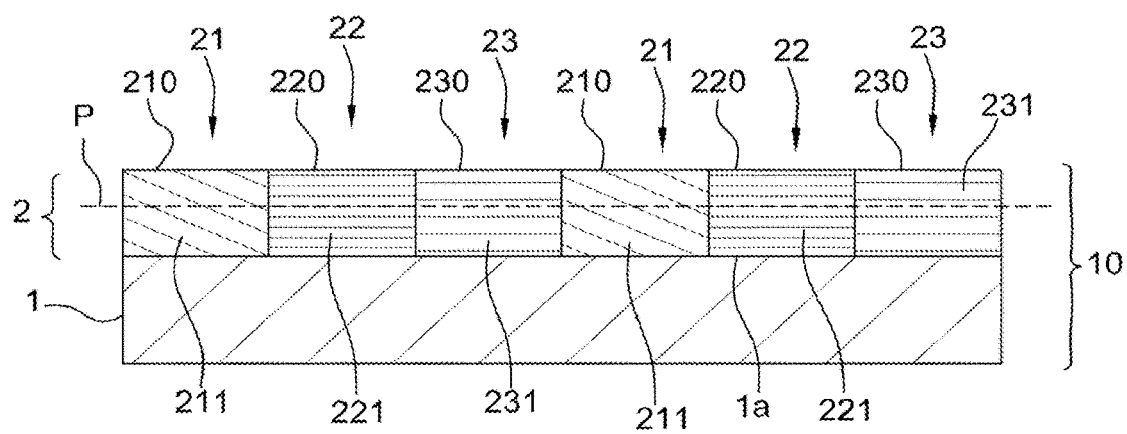
FIG. 1 is a schematic view of a first embodiment of a pseudo-substrate according to an aspect of the invention.
Figure 11:
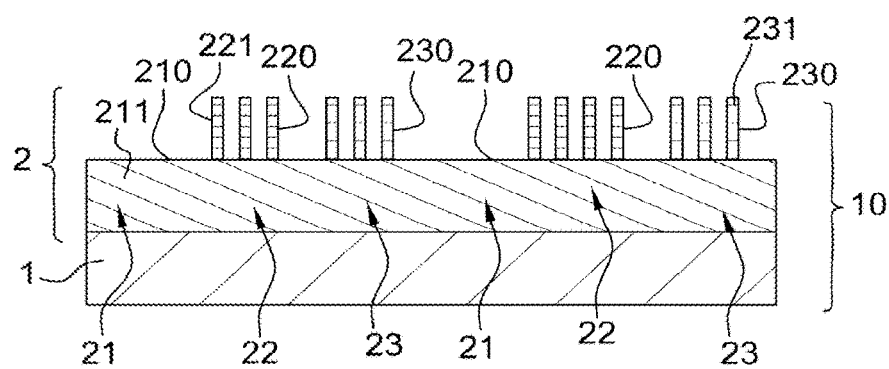
FIG. 11 is a schematic view of a second embodiment of a pseudo-substrate according to the invention.

FIGS. 1 and 11 schematically represent, respectively first and second embodiments of a pseudo-substrate 10 according to an aspect of the invention, these two embodiments being nonetheless non-limiting and illustrated only by way of example to facilitate understanding of the invention. Each of these two pseudo-substrates 10 is configured so that it can be used for the subsequent manufacturing of an optoelectronic device 100. The invention will find an application in particular in the manufacturing of display screens or image projection systems on the basis of such an optoelectronic arrangement 100.

The pseudo-substrate 10 is in particular suitable for the growth of light-emitting diodes on free surfaces delimited by a buffer structure 2 of the pseudo-substrate 10 formed on an upper face 1a of a substrate 1. More specifically, the light-emitting diodes are intended to be formed on the buffer structure 2 on a side opposite the substrate 1 seen in a direction perpendicular to the plane of the substrate 1.

According to one embodiment, the substrate 1 is made of silicon, of a bulk III-V semiconductor (for example GaN), of sapphire or of spinel. It can alternatively be a substrate of the silicon on insulator type or <<SOI>> for <<Silicon On Insulator>>.

The buffer structure 2 can be directly formed on the upper face 1a of the substrate 1, by means of direct contact between the substrate 1 and the layers of the buffer structure 2. Alternatively, the buffer structure 2 can be indirectly formed on the substrate 1 in the hypothesis where an intermediate layer would be present between the substrate 1 and the buffer structure 2, such as for example a nucleation layer not represented.

Figure 7:
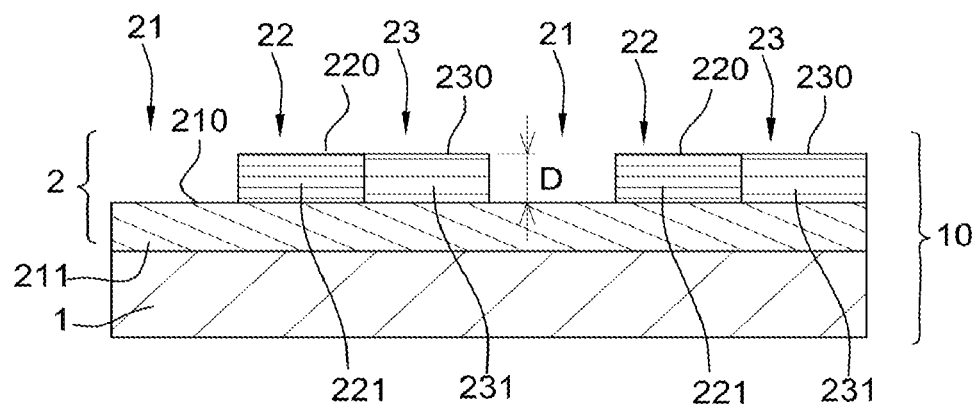
Figure 9:
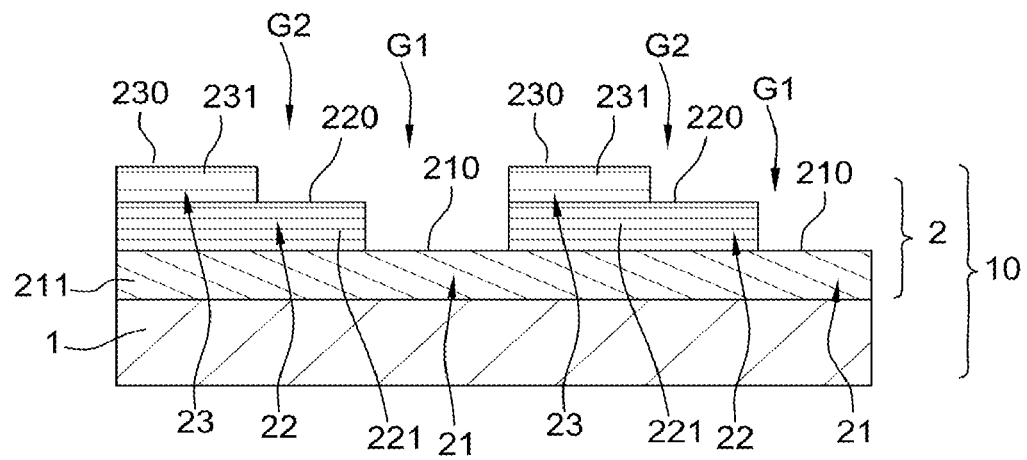

Essentially, the two embodiments of FIGS. 1 and 11 differ from each other in the manner of forming the buffer structure 2, even if the general principles presented below are applied in each of the two embodiments. FIGS. 7 and 9 show two other additional embodiments of a pseudo-substrate 10 according to the invention.

The nature and the organization of the buffer structure 2 which is formed on the substrate 1 represent a real advance relative to the state of the art presented in this document, with the aim of presenting a simple and economical manufacturing while limiting the connections and manipulations of light-emitting diodes and/or to obtain a high light output for the optoelectronic device 100.

To this end, the buffer structure 2 comprises at least one first portion 21 where a layer 211 formed of bulk gallium nitride (GaN) delimits at least one free surface of a first type 210 turned on the side opposite to the upper face of the substrate 1. Each free surface of the first type 210 is adapted to the growth thereon of at least one light-emitting diode 11 mainly based on a III-V compound capable of emitting light L1 (diagrammatically shown in FIGS. 2 and 10) at a first wavelength. The first wavelength directly depends on the composition of the material delimiting the free surface of the first type 210.

In addition, the buffer structure 2 comprises at least one second portion 22 where a stack 221 alternating layers of indium gallium nitride (InGaN) and intermediate layers of GaN and in which the indium is present in a first given mass proportion, delimits at least one free surface of a second type 220 facing the side opposite to the upper face 1a of the substrate 1. Each free surface of the second type 220 is adapted to the growth thereon of at least one light-emitting diode 12 mainly based on a III-V compound capable of emitting light L2 (diagrammatically shown in FIGS. 2 and 10) at a second wavelength different from the first wavelength mentioned in the previous paragraph. The second wavelength directly depends on the composition of the material delimiting the free surface of the second type 220.

For example, each layer of InGaN has a thickness of less than 9 nm and each intermediate layer of GaN has a thickness of more than 9 nm.

Thus, a luminous pixel capable of emitting two lights L1 and L2 at two distinct wavelengths can be formed during the same manufacturing method and this allows considerably reducing the number of manipulation, the manufacturing time, the number of connections and/or the number of tests. This allows also overcoming the need to use color converters, further facilitating manufacturing and achieving very good light outputs.

In FIG. 1, the pseudo-substrate 10 includes two first portions 21 and two second portions 22, delimiting only by way of example and illustration, two distinct free surfaces of the first type 210 and two distinct free surfaces of the second type 220. It goes without saying that the number of free surfaces of the first type 210 and their distribution can be arbitrary. The same is true for free surfaces of the second type 220.

As can be seen in FIG. 1, 7, 9 or 11, said at least one second portion 22 of the buffer structure 2 is offset relative to said at least one first portion 21 of the buffer structure 2 in a general plane P (visible in FIG. 1) oriented parallel to the plane of the upper face 1a of the substrate 1. Such offsets in the general plane P between the different free surfaces of the first type and of the second type 210, 220 allows, once the light-emitting diodes 11, 12 are formed thereon, ensuring a distribution of the light-emitting diodes 11, 12 in the plane parallel to the plane of the substrate 1. This arrangement is advantageous for the manufacturing of display screens or image projection systems requiring an emission surface where the light pixels are distributed.

It is emphasized that FIG. 1 does not really provide dimensional or organizational limitation of the buffer structure 2. Thus, each free surface of the first type 210 can be planar, or not. The free surfaces of the first type 210 can be located in the same plane as the free surfaces of the second type 220, or not (in the sense that there may be a vertical offset from one to the other in the perpendicular direction in the general plane P, that is to say perpendicular to the plane of the substrate 1). Likewise, each free surface of the second type 220 may or may not be planar. In this sense, FIG. 11 illustrates a particular case in which the stack 221 which alternates layers of InGaN and intermediate layers of GaN of said at least one second portion 22 is in the form of at least one nanowire formed on the layer 211 formed of bulk GaN. Such stacks 221 in the form of nanowires can be obtained by any known technique, for example by etching through a GaN/InGaN stack more extensive in the plane P, or even for example by successive growths through corresponding masks. Such an organization can in particular facilitate the formation of light-emitting diodes in the form of nanowires on such free surfaces of the second type 220 themselves in the form of nanowires, whether they are light-emitting diodes having a core-shell structure or an axial structure.

Figure 12:
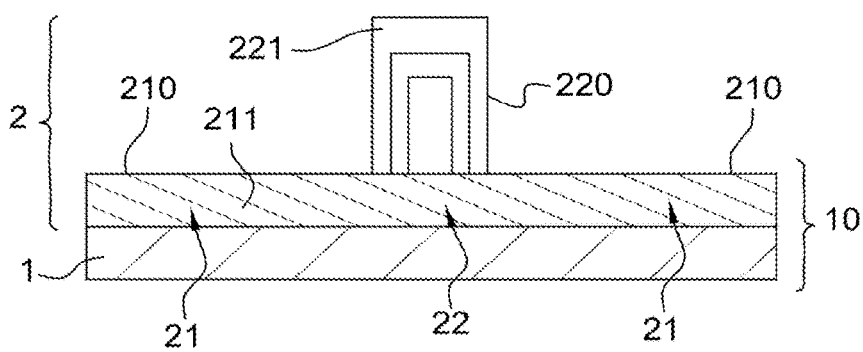
FIG. 12 is a schematic view of a third embodiment of a pseudo-substrate according to the invention.

If FIG. 11 illustrates the particular case where the layers of InGaN and the intermediate layers are axially stacked along the height of the nanowire which they constitute, FIG. 12 illustrates an alternative embodiment where, to constitute the stack 221, these layers would be stacked concentrically according to a core-shell structure with an InGaN core then an intermediate GaN layer covering the lateral and upper edges of this core, then an InGaN layer covering the lateral and upper edges of the GaN intermediate layer, then a new GaN intermediate layer, etc.

Figure 13:
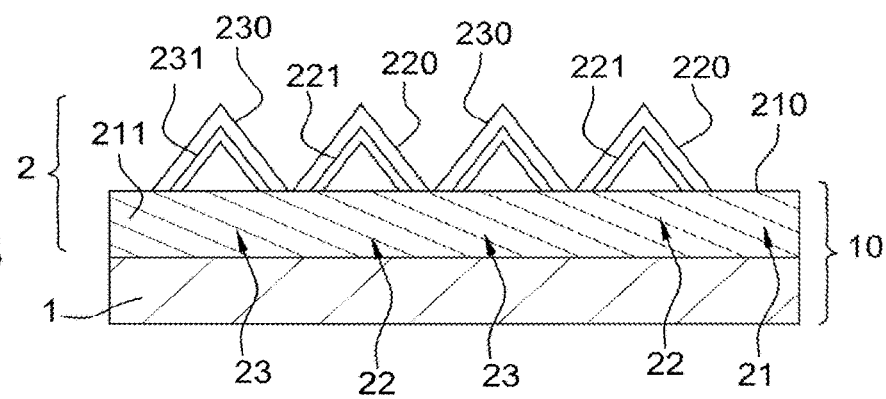
FIG. 13 is a schematic view of a fourth embodiment of a pseudo-substrate according to the invention.

FIG. 13 illustrates another embodiment in which the stack 221 which alternates layers of InGaN and intermediate layers of GaN of said at least one second portion 22 is in the form of at least one pyramid formed on the layer 211 formed of bulk GaN. Such stacks 221 in the form of pyramids can be obtained by any known technique. Such an organization can in particular facilitate the formation of light-emitting diodes in the form of pyramids on such free surfaces of the second type 220 themselves in the form of pyramids, in particular light-emitting diodes having a core-shell structure.

Depending on the needs about the organization of the buffer structure 2 according to the applications and/or depending on the manufacturing method selected for the manufacturing of the pseudo-substrate 10, it is possible to provide that at the level of said at least one second portion 22 of the buffer structure 2, the stack 221 which alternates layers of InGaN and intermediate layers of GaN is at least partially formed on the upper face 1a of the substrate 1. This is for example the case in the embodiment of FIG. 1, but this is not the case in the embodiments of FIGS. 11, 12 and 13. The term <<formed on>> means that the stack 221 can be formed directly on the upper face of the substrate 1 or can be formed indirectly thereon with the interposition of a nucleation layer formed on the upper face 1a and on which the stack 221 would be formed. The latter case is advantageously provided when the substrate 1 is made of sapphire or silicon.

For the same reasons, it can be provided that at the level of said at least one second portion 22 of the buffer structure 2, the stack 221 which alternates layers of InGaN and intermediate layers of GaN is at least partially formed on the layer 211 of bulk GaN. This is for example the case in the embodiments of FIGS. 11, 12 and 13, but this is not the case in the embodiment of FIG. 1.

Figure 8:
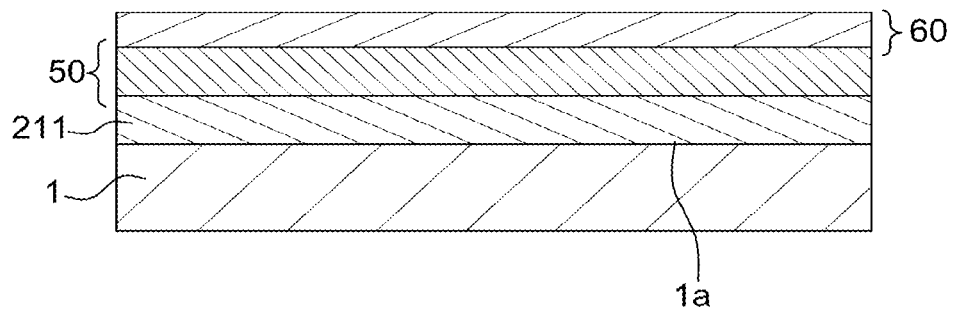
FIGS. 8 and 9 represent different successive steps of a second embodiment of a method for manufacturing the pseudo-substrate.

These different possibilities will also result from the fact that the manufacturing method according to FIGS. 3 to 7 is implemented or not, or whether the manufacturing method associated with FIGS. 8 and 9 is executed out or not.

In addition to the different first portions 21 and the different second portions 22, the buffer structure 2 can optionally but advantageously comprise at least one third portion 23 where a stack 231 alternating layers of InGaN and intermediate layers of GaN and in which indium is present in a second mass proportion different from the first mass proportion previously mentioned, delimits at least one free surface of a third type 230 turned on the side opposite to the upper face 1a of the substrate 1. Each free surface of the third type 230 is adapted to the growth thereon of at least one light-emitting diode 13 mainly based on a III-V compound capable of emitting light L3 (diagrammatically shown in FIGS. 2 and 10) at a third wavelength different from the first wavelength and the second wavelength. The third wavelength depends directly on the composition of the material delimiting the free surface of the third type 230.

As can be seen in FIG. 1, 7, 9, 11 or 13, said at least one third portion 23 of the buffer structure 2 is offset relative to said at least one first portion 21 of the buffer structure 2 and relative to said at least one second portion 22 of the buffer structure 2 (as well as relative to any other potential third portions 23) in the general plane P. Again, such a distribution of the free surfaces of the third type 230 relative to the other free surfaces 210, 220, 230 promotes the manufacturing of display screens or image projection systems requiring an emission surface where the light pixels are distributed.

In FIG. 1, the pseudo-substrate 10 includes two third portions 23 delimiting, only by way of example and illustration, two distinct free surfaces of the third type 230. It goes without saying that the number of free surfaces of the first type 230 and their distribution can be arbitrary.

By the combined presence of free surfaces of the first type 210, of free surfaces of the second type 220 and of free surfaces of the third type 230, it is possible to constitute luminous pixels capable of emitting three kinds of light L1, L2 and L3 at three different wavelengths, without the need for light converters. Thus, the light output remains high while the solution described here eliminates the obligations of cutting the substrates and then reconstructing the light pixels.

Once again, depending on the needs about the organization of the buffer structure 2 according to the applications and/or depending on the manufacturing method selected for the manufacturing of the pseudo-substrate 10, it is possible to provide that at the level of said at least one third portion 23 of the buffer structure 2, the stack 231 which alternates layers of InGaN and intermediate layers of GaN is at least partially formed on the upper face 1a of the substrate 1. This is for example the case in the embodiment of FIG. 1, but this is not the case in the embodiments of FIGS. 11 and 13. The term <<formed on>> means that the stack 231 can be formed directly on the upper face 1a of the substrate 1 or can be formed indirectly on the latter with the interposition of the nucleation layer formed on the upper face 1a and on which the stack 231 would be formed. For the same reasons, it can be provided that at the level of said at least one third portion 23 of the buffer structure 2, the stack 231 which alternates layers of InGaN and intermediate layers of GaN is at least partially formed on the layer 211 of bulk GaN and/or on the stack 221 of said at least one second portion 22. This is for example the case in the embodiments of FIGS. 11 and 13, but this is not the case in the embodiment of FIG. 1.

The free surfaces of the third type 230 may be located in the same plane as the free surfaces 210, 220, or not (in the sense that there may be a vertical offset from one to the other in the direction perpendicular to the general plane P, that is to say perpendicular to the plane of the substrate 1). Each free surface of the third type 230 can be planar (as is the case in FIG. 1 by way of illustration), or not. In this sense, FIG. 11 illustrates a particular case in which the stack 231 which alternates layers of InGaN and intermediate layers of GaN of said at least one third portion 23 is in the form of at least one nanowire formed on the layer 211 of bulk GaN. Such stacks 231 in the form of nanowires can be obtained by any known technique, for example by etching through a GaN/InGaN stack more extensive in the plane P, or even for example by successive growths through corresponding masks. Such an organization can in particular facilitate the formation of light-emitting diodes 13 in the form of nanowires on such free surfaces of the third type 230 themselves in the form of nanowires, whether they are light-emitting diodes having a core-shell structure or an axial structure.

FIG. 13 alternatively illustrates the fact that, to constitute the stack 231 which alternates layers of InGaN and intermediate layers of GaN of said at least one third portion 23 is in the form of at least one pyramid formed on the layer 211 formed from bulk GaN. Such stacks 231 in the form of pyramids can be obtained by any known technique. Such an organization can in particular facilitate the formation of light-emitting diodes in the form of pyramids on such free surfaces of the third type 230 themselves in the form of pyramids, in particular light-emitting diodes having a core-shell structure.

The term <<free surface>> means a surface which is not covered, in the sense that at the time of the subsequent formation of the light-emitting diodes, it allows forming at least one such light-emitting diode from the latter, in order to constitute an optoelectronic device 100 capable of emitting two or three lights L1, L2 and possibly L3 at different wavelengths without being equipped with color converters as was the case before if one wished to get rid of the known solution <<pick and place>>. An important idea is therefore based on the fact, for the Applicant, of having identified that the combined presence of at least one free surface of the first type 210 delimited by a layer 211 of bulk GaN and of at least one free surface of the second type 220 delimited by a stack 221 alternating layers of GaN and layers of InGaN by implying a presence of indium according to the first mass proportion, made it possible to obtain, after the formation of light-emitting diodes in an identical manner from a free surface 210, 220 to the other, an optoelectronic device 100 capable of naturally emitting two different lights L1 and L2, typically in the blue and red colors, or in blue and green colors.

In fact, each free surface of the first type 210 is adapted to allow the growth of at least one light-emitting diode capable of emitting light L1 of blue colors. By adjusting the first mass proportion of indium in the stack 221, it is possible to finally adjust the second wavelength of the light L2 emitted by a light-emitting diode 12 formed on the free surface of the second type 220 delimited by this stack 221.

On the other hand, it has been identified by the Applicant that the additional presence of at least one free surface of the third type 230 delimited by a stack 231 alternating layers of GaN and layers of InGaN by implying a presence of indium according to the second mass proportion, makes it possible to obtain, after the formation of light-emitting diodes 11, 12, 13 in an identical manner from one free surface 210, 220, 230 to the other, an optoelectronic device 100 capable of naturally emitting a third light L3 different from the lights L1, L2, typically in the green colors if the light L2 is in the red colors, or in the red colors if the light L2 is in the green colors.

To be more precise, according to one embodiment, the first mass proportion of indium in the stack 221 at each second portion 22 of the buffer structure 2 is included in a range between 5% and 25%. Preferably, the first mass proportion of indium in the stack 221 at each second portion 22 of the buffer structure 2 is included in a range between 10% and 20%. It has been observed by the Applicant that such a characteristic allows the light L2 to be in the green colors. Typically, the second wavelength is in a range from 500 to 560 nm.

In this embodiment, the optoelectronic device 100 is then capable of emitting at least one light L1 in the blue colors and one light L2 in the green colors.

Still in this embodiment, assuming the arrangement of at least one third portion 23 in the buffer structure 2, it will be very advantageous for the second mass proportion of indium in the stack 231 at each third portion 23 to be included in a range between 15% and 50%. Preferably, the second mass proportion of indium in the stack 231 at each third portion 23 of the buffer structure 2 is included in a range between 20% and 35%. It has been noted by the Applicant that such a characteristic allows the light L3 to be in the red colors. Typically, the third wavelength is in a range from 600 to 700 nm.

According to another embodiment, the first mass proportion of indium in the stack 221 at each second portion 22 of the buffer structure 2 is included in a range between 15% and 50%. Preferably, the first mass proportion of indium in the stack 221 at each second portion 22 of the buffer structure 2 is included in a range between 20% and 35%. It has been noted by the Applicant that such a characteristic allows the light L2 to be in the red colors. Typically, the second wavelength is in a range from 580 to 680 nm.

In this embodiment, the optoelectronic device 100 is then capable of emitting at least one light L1 in the blue colors and one light L2 in the red colors.

Still in this embodiment, assuming the arrangement of at least one third portion 23 in the buffer structure 2, it will be very advantageous for the second mass proportion of indium in the stack 231 at each third portion 23 to be included in a range between 5% and 25%. Preferably, the second mass proportion of indium in the stack 231 at each third portion 23 of the buffer structure 2 is included in a range between 10% and 20%. It has been noted by the Applicant that such a characteristic allows the light L3 to be in the green colors. Typically, the third wavelength is in a range from 500 to 560 nm.

The first mass proportion of indium in the stack 221 of said at least one second portion 22 can be adjusted in particular by means of various parameters, namely the flow of indium during the growth of the layers of InGaN, the temperature during this growth, annealing conditions, implantation conditions. The same is true for the adjustment of the second mass proportion of indium in the stack 231 of said at least one third portion 23.

The pseudo-substrate 10 which has been previously described is suitable for obtaining an optoelectronic device 100 as defined at the beginning of this document. For this, light-emitting diodes 11, 12 are formed on the different free surfaces of the first type 210 and second type 220 respectively of the different portions 21, 22 of the buffer structure 2. In the case where the buffer structure 2 also includes said at least one third portion 23, at least one light-emitting diode 13 is also formed on the different free surfaces of the third type 230. Advantageously, the manner of forming the light-emitting diodes 11, 12, 13 is identical at the level of all the first and second portions 21, 22, or even also at the level of all the third portions 23, of the buffer structure 2. This makes the method for obtaining the optoelectronic device 100 particularly simple, despite all of its advantages already presented.

The provision of such a pseudo-substrate very advantageously makes it possible to incorporate high quantities of indium, in particular in a proportion greater than 20%, in quantum wells of InGaN without degrading the efficiency of the wells.

Figure 2:
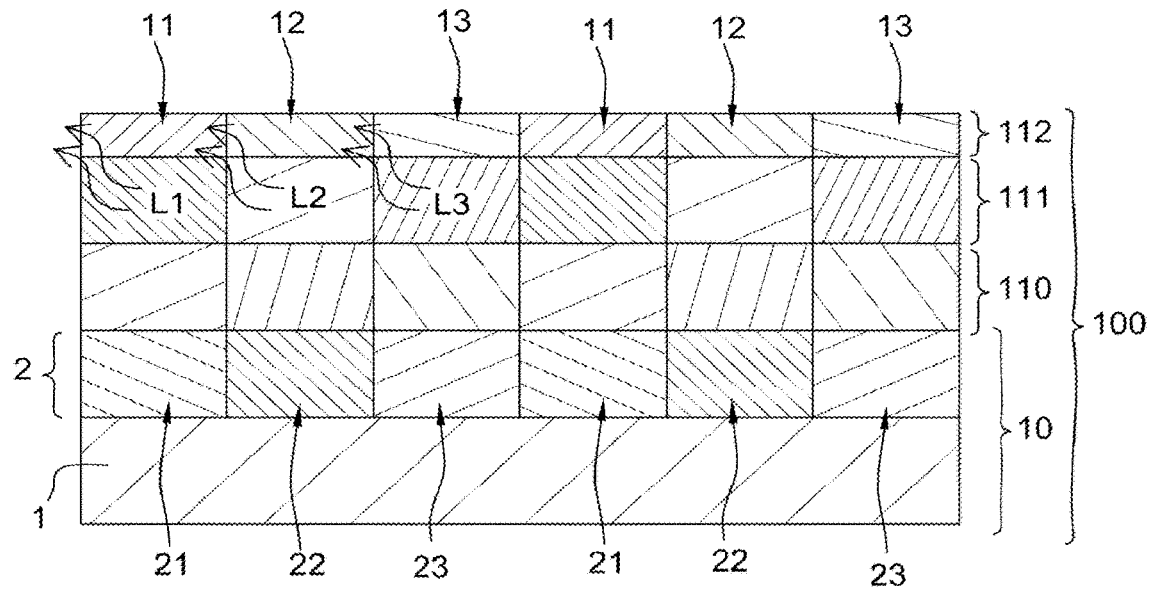
FIG. 2 is a schematic view of a first embodiment of an optoelectronic device according to another aspect of the invention.
Figure 10:
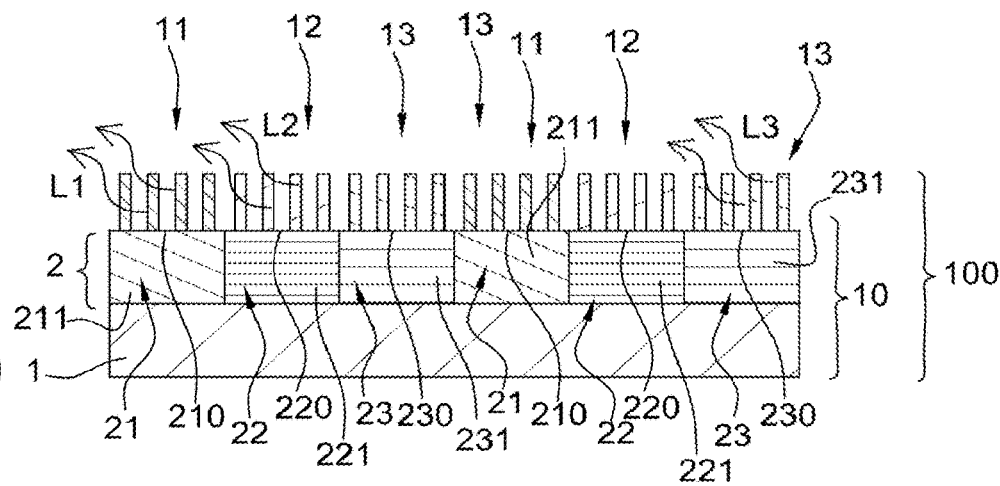
FIG. 10 schematically illustrates a second embodiment of an optoelectronic device according to the invention.

FIGS. 2 and 10 show two different embodiments of the optoelectronic device 100. Essentially, the two embodiments of FIGS. 2 and 10 differ from each other in terms of how to form the light-emitting diodes 11, 12, 13 on the buffer structure 2 of the pseudo-substrate 10, even if the general principles presented below are applied by these two embodiments.

Referring to FIGS. 2 and 10, the optoelectronic device 100 comprises the pseudo-substrate 10 described above and at least one light-emitting diode 11 mainly based on a III-V compound formed by growth on the free surface of the first type 210 of said at least one first portion 21 of the buffer structure 2 of the pseudo-substrate 10, this light-emitting diode 11 being capable of emitting light L1 at the first wavelength.

The optoelectronic device 100, whether in FIG. 2 or according to FIG. 10, also comprises at least one light-emitting diode 12 mainly based on a III-V compound formed by growth on the free surface of the second type 220 of said at least one second portion 22 of the buffer structure 2 of the pseudo-substrate 10, this light-emitting diode 12 being capable of emitting light L2 at the second wavelength.

The optoelectronic device 100 can optionally comprise at least one light-emitting diode 13 mainly based on a compound III-V formed by growth on the free surface of the third type 230 of said at least one third portion 23 of the buffer structure 2 of the pseudo-substrate 10, this light-emitting diode 13 being capable of emitting light L3 at the third wavelength.

Each light-emitting diode 11, 12, 13 can be formed on the basis of three-dimensional semiconductor elements, themselves at least partially obtained by epitaxial growth from the free surfaces 210, 220 or even 230. The light-emitting diodes 11, 12, 13 are therefore formed from a semiconductor material of the III-V compound type, in particular gallium nitride (GaN), indium gallium nitride (InGaN) or aluminum gallium nitride (AlGaN).

With reference to the embodiment of FIG. 10, each light-emitting diode 11, 12, 13 can comprise three-dimensional semiconductor nano-elements, preferably made of doped InGaN or GaN, of wire, conical (or pyramidal) or frustoconical shape. Three-dimensional light-emitting diodes allow reducing the surface recombination of the carriers and are therefore potentially more efficient than two-dimensional structures. This also makes it possible to improve the quality of the material of the quantum wells, to have a larger developed surface and to have more light colored light-emitting diodes.

Conversely, in the embodiment of FIG. 2, the light-emitting diodes 11, 12, 13 are on the contrary obtained in the form of a monolithic structure formed on the buffer structure 2 on the side opposite to the substrate 1, this monolithic structure being capable of emitting polychrome light from the light-emitting diodes 11, 12, 13 which it constitutes. The monolithic structure comprises a layer 110 deposited on the free surfaces of the first type 210 and on the free surfaces of the second type 220, or even also on the free surfaces of the third type 230, in order to constitute one of the doped junctions of the light-emitting diodes 11, 12, 13. For example, the layer 110 is doped so as to constitute an n-doped semiconductor. It may be gallium nitride doped with silicon or indium gallium nitride (InGaN). A layer 111 of active material is then deposited on layer 110, typically based on InGaN. Then a layer 112 is deposited on the layer 111 to constitute the other doped junction of the light-emitting diodes. For example, the layer 112 is doped so as to constitute a p-doped semiconductor. It may be gallium nitride doped with magnesium for example. These layers 110, 112 and 112 constitute light-emitting diodes 11, 12, 13 respectively at the level of the first portions 21, the second portions 22 and the optional third portions 23 of the buffer structure 2 of the pseudo-substrate 10.

In the present solution, by the nature of the free surfaces of the first type 210 and of the free surfaces of the second type 220, or even by the nature of the free surfaces of the third type 230, the light-emitting diodes 11, 12, 13 which are nevertheless formed from of a single common formation procedure for the entire optoelectronic device 100, are capable of emitting lights L1, L2 and L3 at different wavelengths, in particular located in the blue colors, the red colors and the green colors, without the need for color converters. The light output is very high and the manufacturing is simple and economical.

To achieve the manufacturing of a pseudo-substrate 10, whose principles have been exposed above, for example illustrated in FIG. 1 or in FIG. 11, it is necessary to implement at least the following general steps:
  a first step of providing the substrate 1, a second step of forming the layer 211 formed of bulk GaN on the upper face 1a of the substrate 1,
  a third step of forming the stack 221 which alternates layers of InGaN and intermediate layers of GaN and in which the indium is present in the first mass proportion, on the layer 211 of bulk GaN which results from the second step and/or on the upper face 1a of the substrate 1.

The method can then comprise a fourth step of forming the stack 231 which alternates layers of InGaN and intermediate layers of GaN and in which the indium is present in the second mass proportion, on the layer 211 of bulk GaN resulting from the second step and/or on the stack 221 resulting from the third step.

There will now be described two different embodiments of this general manufacturing method.

Thus, FIGS. 3 to 7 represent different successive steps of the first embodiment of a method for manufacturing the pseudo-substrate 10.

Figure 3:
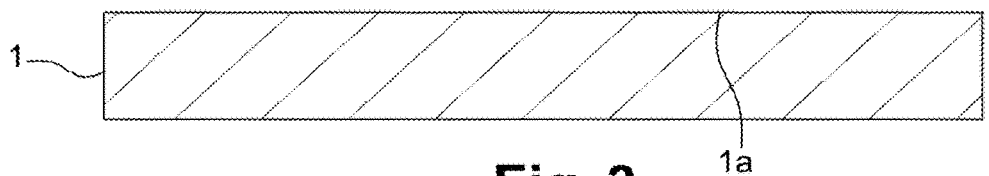
FIGS. 3 to 7 represent different successive steps of a first embodiment of a method for manufacturing the pseudo-substrate.

FIG. 3 represents the step of providing the substrate 1, disposing the upper face suitable for the formation thereon of the buffer structure 2. The step of providing the substrate 1 can comprise any of the steps known to those skilled in the art for this purpose (cleaning the face 1a, mechanical or chemical rectification of the face 1a, etc.). It may also be provided the formation of a nucleation layer between the substrate 1 and the buffer structure 2 proper.

Figure 5:
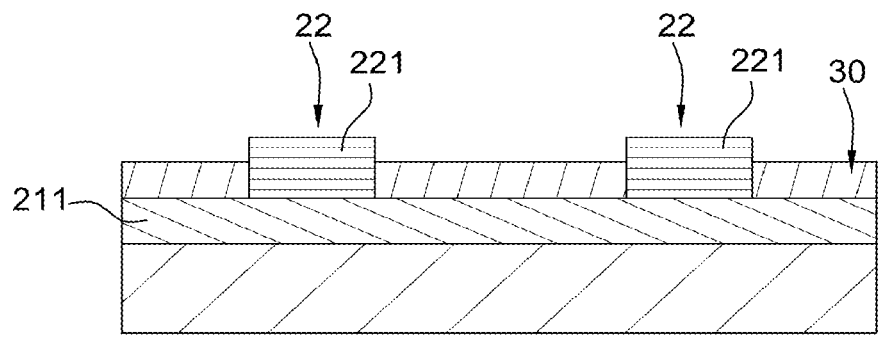
Figure 6:
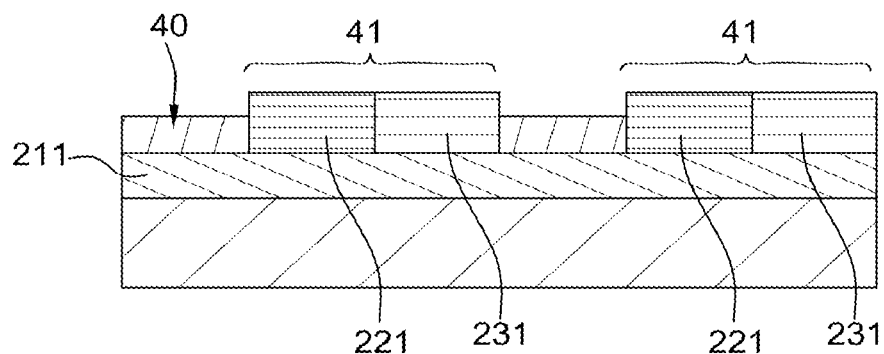

Generally in this first embodiment of the method for manufacturing the pseudo-substrate 10, with reference to FIG. 5, the third step comprises successive steps of depositing layers of InGaN and intermediate layers of GaN in openings 31 delimited by a first mask 30 covering the layer 211 of bulk GaN resulting from the second step.

Figure 4:
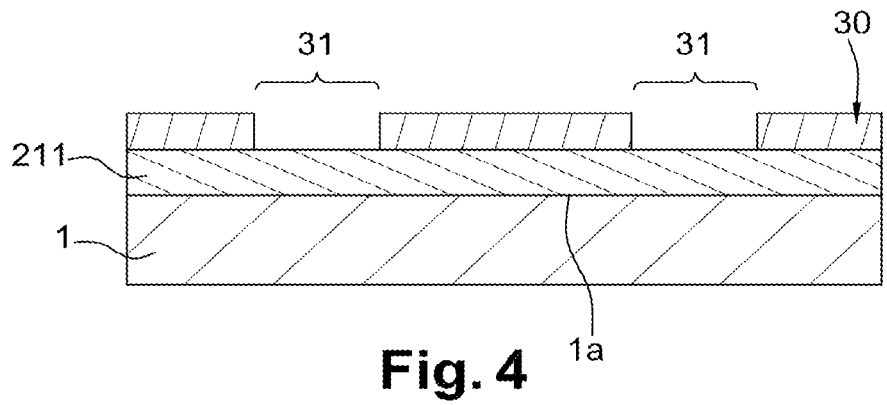

FIG. 4 illustrates the intermediate situation in which the first mask 30 partially covers the layer 211 of bulk GaN, before the implementation of the successive steps of depositing the layers of InGaN and intermediate layers of GaN. In the example as illustrated, this being non-limiting, the openings 31 of the first mask 30 correspond to the second portions 22 of the buffer structure 2, defining the free surfaces of the second type 220 after the removal of the first mask 30.

Then, in the first embodiment of the manufacturing method, the fourth step comprises (FIG. 6) successive steps of depositing layers of InGaN and intermediate layers of GaN in all or part of the openings 41 surface of a second mask 40 covering at least the layer 211 of bulk GaN which results from the second step. In the example as illustrated, this being non-limiting, the second mask 40 exactly covers the areas of the underlying layer 211 which are intended to constitute, at the end of the manufacturing method and after removal of the second mask 40, the free surfaces of the first type 210. The openings 41 include both the second portions 22 and the third portions 23 of the buffer structure 2. It may be careful to deposit the successive layers of the stack 231 in the openings 41 of the second mask 40 only at the level of the latter where the stack 221 previously formed via the first mask 30 is not present.

FIG. 7 represents the situation after the removal of the second mask 40. The characteristics of the pseudo-substrate 10 thus obtained are identical to those of the pseudo-substrate 10 illustrated in FIG. 1, with the difference that there is an offset D between the free surfaces of the first type 210 on the one hand, and the free surfaces of the second type 220 and of the third type 230 on the other hand, in a direction perpendicular to the general plane P. This arrangement derives from the fact that here the stacks 221 and 231 are formed on the layer 211 of bulk GaN, which is not the case in the pseudo-substrate 10 of the embodiment of FIG. 1.

FIGS. 8 and 9 then represent different successive steps of the second embodiment of the method for manufacturing the pseudo-substrate 10.

Generally, in this second embodiment of the method for manufacturing the pseudo-substrate 10, the third step comprises (FIG. 8):
a first set of successive steps of depositing layers of InGaN and intermediate layers of GaN over the entire surface of the layer 211 of bulk GaN which results from the second step, forming a stack referenced 50,
then a first etching step (FIG. 9) symbolized by the reference G1, through the stack 50 which results from this first set of successive steps of depositing InGaN/GaN.

This first etching step G1 is carried out so as to make determined surfaces of the layer 211 of bulk GaN free, these surfaces thus made free by etching corresponding to the free surfaces of the first type 210 of said at least one first portion 21 of the buffer structure 2. Thus, the areas where the first etching G1 is carried out correspond to the first portions 21 of the buffer structure 2 of the pseudo-substrate 10. In these areas, the upper face of the underlying layer 211 of bulk GaN becomes a free surface suitable for subsequent growth of light-emitting diodes 11.

Then, in the second embodiment of the manufacturing method, the fourth step comprises:
a second set of successive steps of depositing layers of InGaN and intermediate layers of GaN over the entire surface of the stack 50 which itself results from the first set of successive depositing steps, forming a stack referenced 60 (FIG. 8),
then a second etching step (FIG. 9) symbolized by the reference G2, through the stack 60 which results from the second set of successive steps of depositing InGaN/GaN.

This second etching step G2 is carried out so as to make determined surfaces of the stack 50 which results from the first set of successive depositing steps free. These surfaces of the stack 50 thus made free correspond to the free surfaces of the second type 220 of said at least one second portion 22 of the buffer structure 2.

The first etching G1 can be carried out by any known and suitable technique, for example by mechanical or chemical means. It is the same for the second etching G2.

FIG. 9 thus represents the pseudo-substrate 10 obtained following the two etchings G1, G2.

The portion of the stack 50 not etched during the first etching G1 and not covered by the stack 60 constitutes in practice the stack 221 defined previously for each second portion 21. The areas where the second etching G2 is carried out but where the first etching G1 is not carried out correspond to the second portions 22 of the buffer structure 2 of the pseudo-substrate 10. In these areas, the upper face of the stack 50 becomes a free surface suitable for subsequent growth of light-emitting diodes 12.

The portion of the stack 60 not etched during the second etching G2 constitutes in practice the stack 231 defined previously for each third portion 23. The areas where the second etching G2 is not carried out, nor the first etching G1, correspond to the third portions 23 of the buffer structure 2 of the pseudo-substrate 10. In these areas, the upper face of the stack 60 is a free surface suitable for subsequent growth of light-emitting diodes 13.

FIGS. 8 and 9 represent the particular case in which the second set of the depositing steps, leading to the formation of the stack referenced 60, is carried out before the implementation of the first etching G1. This arrangement makes the manufacturing method simpler to execute but without this being limiting. It can quite be envisaged, as a variant, that the first etching G1 be carried out through the stack 50 before the second set of the depositing steps which leads to the stack 60 is carried out.

Furthermore, in the case where the second set of the depositing steps, leading to the formation of the stack referenced 60, is carried out before the implementation of the first etching G1 (leading to the situation in FIG. 8), it is possible to carry out the first etching G1 before carrying out the second etching G2, or conversely to carry out the second etching G2 before carrying out the first etching G1.

To obtain an optoelectronic device 100, whose principles have been exposed above, for example illustrated in FIG. 2 or in FIG. 11, it is necessary to implement at least one first phase of providing the pseudo-substrate 10 by implementing the manufacturing method described above, then a second phase of forming:

at least one light-emitting diode 11 by growth on each free surface of the first type 210 of said at least one first portion 21 of the buffer structure 2 of the pseudo-substrate 10 provided in the first phase, this light-emitting diode 11 being capable of emitting light L1 at the first wavelength, and at least one light-emitting diode 12 by growth on each free surface of the second type 220 of said at least one second portion 22 of the buffer structure 2 of the pseudo-substrate 10 provided in the first phase, this light-emitting diode 12 being capable of emitting light L2 at the second wavelength which is different from the first wavelength.

The method for obtaining the optoelectronic device 100 can then comprise an optional third phase of forming at least one light-emitting diode 13 by growth on each free surface of the third type 230 of said at least one third portion 23 of the buffer structure 2 of the pseudo-substrate 10 provided in the first phase. This light-emitting diode 13 is in particular capable of emitting light L3 at the third wavelength different from the first and second wavelengths respectively of lights L1 and L2.

As already previously indicated, different techniques for forming light-emitting diodes 11, 12, 13 can be envisaged.

Thus according to a first possible embodiment (FIG. 10), each light-emitting diode 11, 12, 13 is formed on the basis of three-dimensional semiconductor elements, themselves at least partially obtained by epitaxial growth from the free surfaces 210, 220, 230. The light-emitting diodes 11, 12, 13 are therefore formed based on a semiconductor material of the III-V compound type, in particular the gallium nitride (GaN), the indium gallium nitride (InGaN) or the aluminum gallium nitride (AlGaN). Typically, each light-emitting diode 11, 12, 13 formed in the second phase and in the third phase may comprise three-dimensional semiconductor nano-elements, preferably made of InGaN or doped GaN, of wire, conical or frustoconical shape, formed by epitaxy from free surfaces of the first type 210, free surfaces of the second type 220 and free surfaces of the third type 230. These techniques are conventional for those skilled in the art who will easily be able to adapt them to the present case.

According to a second possible embodiment (with reference to FIG. 2 for example), the light-emitting diodes 11, 12, 13 are formed in the form of a monolithic structure formed on the buffer structure 2 on the side opposite to the substrate 1, this monolithic structure being capable of emitting polychrome light from the light-emitting diodes 11, 12, 13 which it constitutes. The second phase of formation of light-emitting diodes 11, 12 on the free surfaces of the first type 210 and on the free surfaces of the second type 220 and the third phase of formation of light-emitting diodes on the free surfaces of the third type 230, can in particular comprise:

a step of depositing a layer 110 on the free surfaces of the first type 210 and on the free surfaces of the second type 220, or even on the free surfaces of the third type 230, in order to constitute one of the doped junctions of the light-emitting diodes 11, 12, 13; for example the layer 110 is doped so as to constitute an n-doped semiconductor material. It may be gallium nitride doped with silicon or InGaN.

a step of depositing a layer 111 of active material, for example by epitaxial growth, on the layer 110, the active material typically being based on indium gallium nitride.

a step of depositing, on the layer 111, a layer 112 of active material to constitute the other doped junction of light-emitting diodes 11, 12, 13; for example the layer 112 is doped so as to constitute a p-doped semiconductor. It may be gallium nitride doped with magnesium for example.

This stack of layers 110, 112 and 112 constitutes light-emitting diodes 11, 12, 13 respectively at the level of the first portions 21, the second portions 22 and possible third portions 23 of the buffer structure 2 of the pseudo-substrate 10.

By the nature of the free surfaces of the first type 210, the free surfaces of the second type 220 and the free surfaces of the third type 230, the light-emitting diodes 11, 12, 13 formed thereon are capable of emitting lights L1, L2, L3 at different wavelengths, although the steps of forming the light-emitting diodes 11, 12, 13 are identical for the entire optoelectronic device 100. This results, once again, in simplicity of manufacturing and reduction in costs for the manufacturing of display screens or image projection systems on the basis of such optoelectronic devices 100. The light output is higher than current solutions and it obviates the need to form color converters under the shape of photoluminescent pads.

Of course, the invention is not limited to the embodiments represented and described above, but on the contrary covers all variants.

The invention claimed is:

1. A pseudo-substrate for optoelectronic device, the pseudo-substrate being adapted to the growth of light-emitting diodes on the pseudo-substrate, the pseudo-substrate comprising a substrate and a buffer structure formed on an upper face of the substrate, the buffer structure comprising:

at least one first portion where a layer formed of bulk gallium nitride (GaN) delimits at least one free surface of a first type turned on the side opposite to the upper face of the substrate, each free surface of the first type being adapted to the growth thereon of at least one light-emitting diode mainly based on a III-V compound capable of emitting light at a first wavelength, and at least one second portion where a stack alternating layers of indium gallium nitride (InGaN) and intermediate layers of GaN and in which the indium is present in a first mass proportion, delimits at least one free surface of a second type turned on the side opposite to the upper face of the substrate, each free surface of the second type being adapted to the growth thereon of at least one light-emitting diode mainly based on a III-V compound capable of emitting light at a second wavelength different from the first wavelength, the at least one second portion of the buffer structure being offset with respect to the at least one first portion of the buffer structure in a general plane oriented parallel to the plane of the upper face of the substrate.

2. The pseudo-substrate according to claim 1, wherein at the level of the at least one second portion of the buffer structure, the stack alternating layers of InGaN and intermediate layers of GaN is at least partially formed on the upper face of the substrate, and wherein the pseudo-substrate comprises a nucleation layer formed on the upper face of the substrate and wherein at the level of the at least one second portion of the buffer structure, the stack alternating layers of InGaN and intermediate layers of GaN is at least partially formed on the nucleation layer.

3. The pseudo-substrate according to claim 2, wherein the stack alternating layers of InGaN and intermediate layers of GaN of the at least one second portion is in the form of at least one nano-element in the form of a wire or in the form of a pyramid.

4. The pseudo-substrate according to claim 1, wherein the buffer structure comprises at least one third portion where a stack alternating layers of InGaN and intermediate layers of GaN and in which indium is present in a second mass proportion strictly different from the first mass proportion, delimits at least one free surface of a third type turned on the side opposite to the upper face of the substrate, each free surface of the third type being adapted to the growth thereon of at least one light-emitting diode mainly based on a III-V compound capable of emitting light at a third wavelength different from the first wavelength and from the second wavelength, and wherein the at least one third portion of the buffer structure is offset with respect to the at least one first portion of the buffer structure and with respect to the at least one second portion of the buffer structure in the general plane oriented parallel to the plane of the upper face of the substrate.

5. The pseudo-substrate according to claim 4, wherein at the level of the at least one third portion of the buffer structure, the stack alternating layers of InGaN and intermediate layers of GaN is at least partially formed on the upper face of the substrate, and the pseudo-substrate comprises a nucleation layer formed on the upper face of the substrate and wherein at the level of the at least one third portion of the buffer structure, the stack alternating layers of InGaN and intermediate layers of GaN is at least partially formed on the nucleation layer.

6. The pseudo-substrate according to claim 4, wherein the stack alternating layers of InGaN and intermediate layers of GaN of the at least one third portion is in the form of at least one nano-element in the form of a wire or in the form of a pyramid.

7. The pseudo-substrate according to claim 1, wherein the first mass proportion of indium at the level of the at least one second portion is included in a range between 5 and 25%, preferably between 10 and 20%.

8. The pseudo-substrate according to claim 4, wherein the second mass proportion of indium at the level of the at least one third portion is included in a range between 5 and 25%, preferably between 10 and 20%.

9. An optoelectronic device comprising a pseudo-substrate according to claim 1 and:
at least one light-emitting diode mainly based on a III-V compound formed by growth on the free surface of the first type of the at least one first portion of the buffer structure of the pseudo-substrate and capable of emitting light at the first wavelength,
at least one light-emitting diode mainly based on a III-V compound formed by growth on the free surface of the second type of the at least one second portion of the buffer structure of the pseudo-substrate and capable of emitting light at the second wavelength different from the first wavelength.

10. The optoelectronic device according to claim 9, wherein the buffer structure comprises at least one third portion where a stack alternating layers of InGaN and intermediate layers of GaN and in which indium is present in a second mass proportion strictly different from the first mass proportion, delimits at least one free surface of a third type turned on the side opposite to the upper face of the substrate, each free surface of the third type being adapted to the growth thereon of at least one light-emitting diode mainly based on a III-V compound capable of emitting light at a third wavelength different from the first wavelength and from the second wavelength, and wherein the at least one third portion of the buffer structure is offset with respect to the at least one first portion of the buffer structure and with respect to the at least one second portion of the buffer structure in the general plane oriented parallel to the plane of the upper face of the substrate, and the optoelectronic device comprises at least one light-emitting diode mainly based on a III-V compound formed by growth on the free surface of the third type of said at least one third portion of the buffer structure of the pseudo-substrate and capable of emitting light at the third wavelength different from the first wavelength and from the second wavelength.

11. A method for manufacturing a pseudo-substrate according to claim 1, wherein the method comprises a first step of providing the substrate, a second step of forming the layer formed of bulk GaN on the upper face of the substrate, a third step of forming the stack alternating layers of InGaN and intermediate layers of GaN and in which indium is present in the first mass proportion, on the layer resulting from the second step and/or on the upper face of the substrate.

12. The method for manufacturing a pseudo-substrate according to claim 11, wherein the third step comprises successive steps of depositing layers of InGaN and intermediate layers of GaN in openings delimited by a first mask covering the layer of bulk GaN resulting from the second step.

13. The method for manufacturing a pseudo-substrate according to claim 11, wherein the third step comprises a first set of successive steps of depositing layers of InGaN and intermediate layers of GaN over the entire surface of the layer resulting from the second step, then a first etching step through a stack which results from the first set of successive deposition steps, the first etching step being carried out so as to make determined surfaces of the layer which results from the second step free, the made free surfaces corresponding to free surfaces of first type of the at least one first portion of the buffer structure.

14. The method for manufacturing a pseudo-substrate according to claim 11, wherein the buffer structure comprises at least one third portion where a stack alternating layers of InGaN and intermediate layers of GaN and in which indium is present in a second mass proportion strictly different from the first mass proportion, delimits at least one free surface of a third type turned on the side opposite to the upper face of the substrate, each free surface of the third type being adapted to the growth thereon of at least one light-emitting diode mainly based on a III-V compound capable of emitting light at a third wavelength different from the first wavelength and from the second wavelength, and wherein the at least one third portion of the buffer structure is offset with respect to the at least one first portion of the buffer structure and with respect to the at least one second portion of the buffer structure in the general plane oriented parallel to the plane of the upper face of the substrate, and wherein the method further comprises a fourth step of forming the stack alternating layers of InGaN and intermediate layers of GaN and in which the indium is present in the second mass proportion, on the layer resulting from the second step and/or on the stack resulting from the third step.

15. The method for manufacturing a pseudo-substrate according to claim 14, wherein the fourth step comprises successive steps of depositing layers of InGaN and intermediate layers of GaN in all or part of the openings surface of a second mask covering at least the layer of bulk GaN which results from the second step.

16. The method for manufacturing a pseudo-substrate according to claim 13, wherein the fourth step comprises a second set of successive steps of depositing layers of InGaN and intermediate layers of GaN on the entire surface of the stack resulting from the first set of successive deposition steps, then a second etching step through a stack which results from the second set of successive deposition steps, the second etching step being carried out so as to make determined surfaces of the stack free which results from the first set of successive deposition steps, the made free surfaces corresponding to free surfaces of the second type of the at least one second portion of the buffer structure.

17. The pseudo-substrate according to claim 3, wherein the buffer structure comprises at least one third portion where a stack alternating layers of InGaN and intermediate layers of GaN and in which indium is present in a second mass proportion strictly different from the first mass proportion, delimits at least one free surface of a third type turned on the side opposite to the upper face of the substrate, each free surface of the third type being adapted to the growth thereon of at least one light-emitting diode mainly based on a III-V compound capable of emitting light at a third wavelength different from the first wavelength and from the second wavelength, and wherein the at least one third portion of the buffer structure is offset with respect to the at least one first portion of the buffer structure and with respect to the at least one second portion of the buffer structure in the general plane oriented parallel to the plane of the upper face of the substrate.

18. The pseudo-substrate according to claim 17, wherein at the level of the at least one third portion of the buffer structure, the stack alternating layers of InGaN and intermediate layers of GaN is at least partially formed on the upper face of the substrate, and wherein the pseudo-substrate comprises a nucleation layer formed on the upper face of the substrate and wherein at the level of the at least one third portion of the buffer structure, the stack alternating layers of InGaN and intermediate layers of GaN is at least partially formed on the nucleation layer.

19. The pseudo-substrate according to claim 18, wherein the stack alternating layers of InGaN and intermediate layers of GaN of the at least one third portion is in the form of at least one nano-element in the form of a wire or in the form of a pyramid.

20. The pseudo-substrate according to claim 19, wherein the first mass proportion of indium at the level of the at least one second portion is included in a range between 5 and 25%, preferably between 10 and 20%.

* * * * *